United States Patent [19]

Suzuki

[11] Patent Number: 4,667,198

[45] Date of Patent: May 19, 1987

[54] APPARATUS FOR MEASURING QUANTITY OF AC ELECTRICITY

[75] Inventor: Sunao Suzuki, Hyogo, Japan

[73] Assignee: Mitsubishi Denki Kabushiki Kaisha, Tokyo, Japan

[21] Appl. No.: 708,856

[22] Filed: Mar. 6, 1985

[30] Foreign Application Priority Data

Jun. 22, 1984 [JP] Japan ................................. 59-129473

[51] Int. Cl.⁴ ............................................ G01R 21/06
[52] U.S. Cl. ...................................... 324/142; 364/483
[58] Field of Search .................... 324/142, 132, 158 R; 328/160; 364/483

[56] References Cited

U.S. PATENT DOCUMENTS 4,291,377  9/1981  Schneider et al. .................... 324/142
4,345,311  8/1982  Fielden ................................. 364/483

OTHER PUBLICATIONS

Krajewski, R.; "The Chameleon Plus"; Byte; Jun. 1984; pp. 327–330, 332, 334, 336.
Protective Relay Engineering, pp. 112–113, The Electric Society of Japan, (Published Jul. 20, 1981).

Primary Examiner—Ernest F. Karlsen
Attorney, Agent, or Firm—Bernard, Rothwell & Brown

[57] ABSTRACT

An apparatus for measuring the quantity of AC electricity, comprising a first and a second arithmetic circuit capable of calculating values corresponding to the sum of and the difference between each sample value obtained by sampling the quantity of AC electricity at a predetermined sampling period and the sample value obtained one sampling period before the former, and a third arithmetic circuit capable of calculating a value corresponding to the difference between the respective output signals of those two arithmetic circuits.

5 Claims, 8 Drawing Figures

FIG. 1
(PRIOR ART)
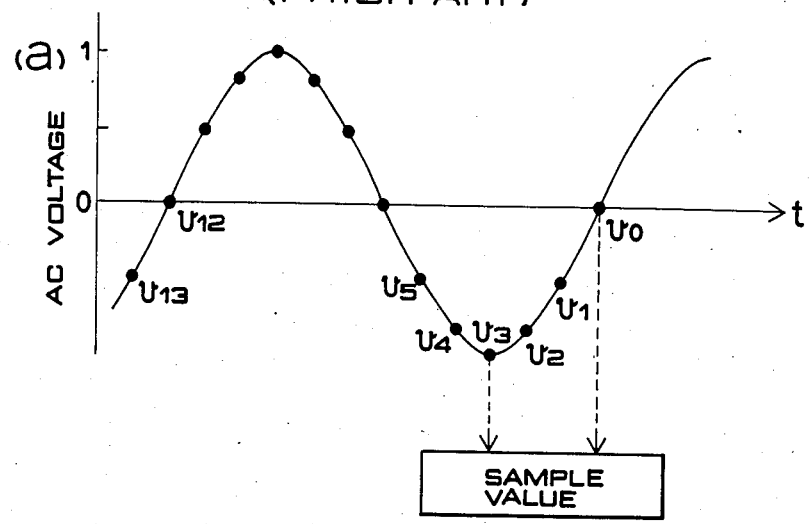
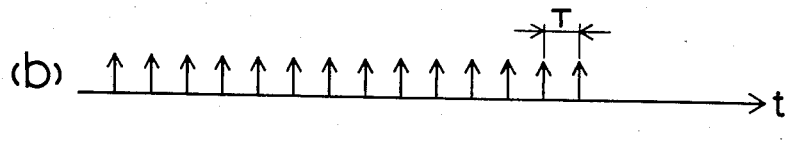
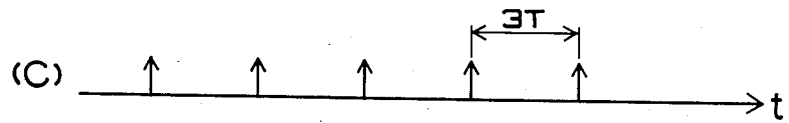
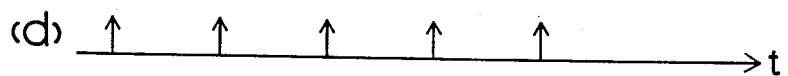

| SAMPLING PERIOD T IN DEGREE / CALCULATED VALUE OF Z₀ | 15° | 30° | 45° | 60° | 90° | 120° |
|---|---|---|---|---|---|---|
| MIN. 1.4142 | 7.5° | 15.0° | | | 0.0° | 15.0° |
| MAX. 1.5307 | 30.0° | 37.5° | 0.0° | 7.5° | 22.5° | 37.5° |
| MIN. 1.4142 | 52.5° | 60.0° | 22.5° | 30.0° | 45.0° | 60.0° |
| MAX. 1.5307 | 75.0° | 82.5° | 45.0° | 52.5° | 67.5° | 82.5° |
| MIN. 1.4142 | 97.5° | 105.0° | 67.5° | 75.0° | 90.0° | 105.0° |
| MAX. 1.5307 | 120.0° | 127.5° | 90.0° | 97.5° | 112.5° | 127.5° |
| MIN. 1.4142 | 142.5° | 150.0° | 112.5° | 120.0° | 135.0° | 150.0° |
| MAX. 1.5307 | 165.0° | 172.5° | 135.0° | 142.5° | 157.5° | 172.5° |
| MIN. 1.4142 | | | 157.5° | 165.5° | 180.0° | |
| MAX. 1.5307 | | | 180.0° | | | |

FIG. 3

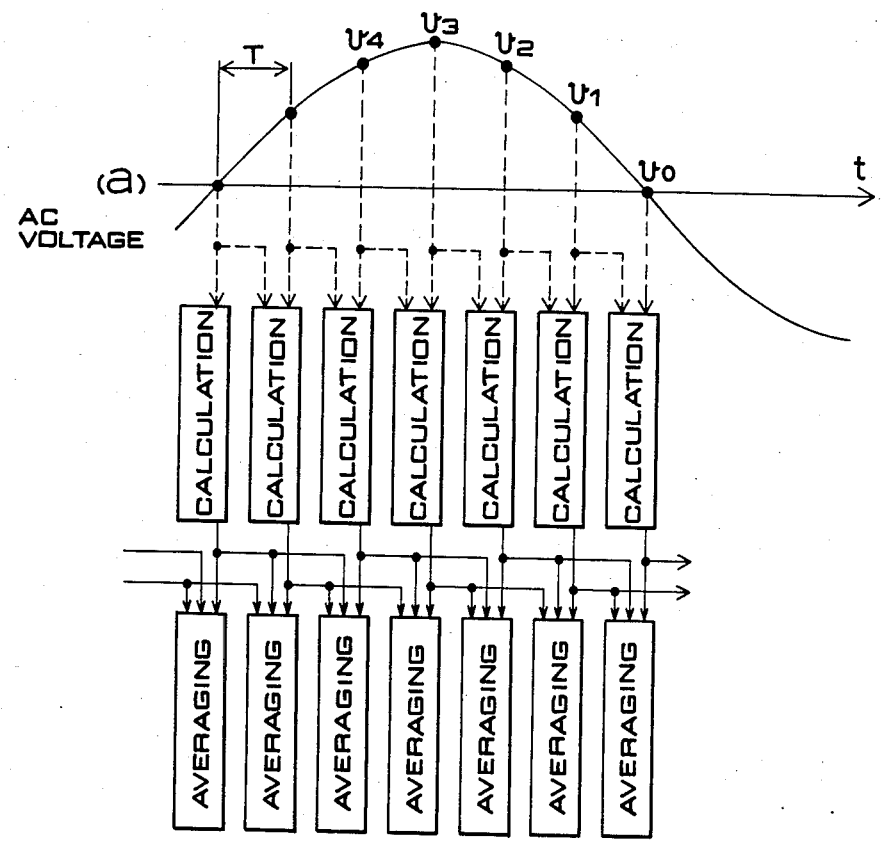

| SAMPLING TIME | CALCULATED Z0 |
|---|---|
| 0° + 30°×n | 1.48316 |
| 1° + 30°×n | 1.48633 |
| 2° + 30°×n | 1.48906 |
| 3° + 30°×n | 1.49133 |
| 4° + 30°×n | 1.49315 |
| 5° + 30°×n | 1.49452 |
| 6° + 30°×n | 1.49543 |
| 7° + 30°×n | 1.49589 |
| 8° + 30°×n | 1.49589 |
| 9° + 30°×n | 1.49543 |
| 10° + 30°×n | 1.49452 |
| 11° + 30°×n | 1.49315 |
| 12° + 30°×n | 1.49133 |
| 13° + 30°×n | 1.48906 |
| 14° + 30°×n | 1.48633 |

1

APPARATUS FOR MEASURING QUANTITY OF AC ELECTRICITY

BACKGROUND OF THE INVENTION

1. Field of the Invention

The present invention relates to an apparatus for measuring the quantity of AC electricity to derive the magnitude of the quantity of AC analog electricity on the basis of signals obtained through periodic sampling of a predetermined frequency.

2. Description of the Prior Art

An apparatus of this kind of the prior art, such as shown in FIG. 1 is introduced in "Hogo Keiden Kogaku" (Protective Relay Engineering), Inst. of Electrical Engineers of Japan, 112-113 (Jul. 20, 1981). In FIG. 1, indicated at (a) is AC voltage, at (b) is sampling time at which the AC voltage (a) is sampled and converted into a digital value, and at (c), (d) and (e) are sampling times within a time interval corresponding to the phase angle of the AC voltage. The period $T=30°$. When the AC voltage was calculated on the basis of the present AC voltage $V_0$ and the AC voltage $V_3$ of 90° before ($3T=90°$), at the sampling time (c) by the use of an expression:

$$Z_0 = |V\sin\theta| + |V\sin(\theta - 3T)| + (\sqrt{2} - 1)||V\sin\theta| - |V\sin(\theta - 3T)|| = |V_0| + |V_3| + (\sqrt{2} -1)||V_0| - |V_3|| \quad (1)$$

the AC voltage was measured at an accuracy corresponding to 4-phase full-wave rectification. As well known, this accuracy is ±5.5%, which corresponds to ripple.

According to another well-known means to measure the AC voltage at a higher accuracy, the AC voltages $V_1$ and $V_4$ at the sampling time (d) and the AC voltages $V_2$ and $V_5$ at the sampling time (e) are used additionally and an operation similar to the Exp. (1) is executed. In this case, the accuracy is ±0.6%.

Since the conventional digital measuring apparatus has the above-mentioned constitution, on principle, the accuracy is deteriorated if the length of time corresponding to the phase angle 90° the AC voltage is not the integral multiple of the sam period T. Accordingly, even if the sampling period is selected correctly, the measuring error can increase when the frequency of the AC voltage varies.

Furthermore, in case the AC voltage has changed suddenly, the method of FIG. 1 needs a time corresponding to $3T+3T=6T=180°$ to detect a correct value, which is quite unsatisfactory in respect of following-up performance.

SUMMARY OF THE INVENTION

Accordingly, it is an object of the present invention to provide an apparatus for measuring the quantity of AC electricity, capable of setting an optional sampling period regardless of the frequency of the quantity of AC electricity to be measured.

Optional setting of the sampling period enables quick measuring in the same measuring accuracy as that of the conventional apparatus, or enables measuring at the same measuring speed as that of the conventional apparatus in a higher measuring accuracy.

The present invention provides an apparatus for measuring the quantity of AC electricity, comprising:

a first arithmetic circuit capable of adding two successive sample values of AC electricity obtained by sampling at a predetermined sampling period, then multiplying the sum by a first constant, and then providing the absolute value of the product;

a second arithmetic circuit capable of performing subtraction between the two successive sample values, then multiplying the remainder by a second constant, and then providing the absolute value of the product;

a third arithmetic circuit capable of multiplying the absolute value of the difference between the output signals of the first and the second arithmetic circuits by a third constant; and a fourth arithmetic circuit capable of calculating the quantity of AC electricity by adding the respective output signals of the first, the second and the third arithmetic circuits.

BRIEF DESCRIPTION OF THE DRAWINGS

FIG. 1 is a graph showing the relation between the waveform of an objective AC voltage and the sampling period, in measuring the quantity of AC analog electricity;

FIG. 3 is a table showing the relation between the sampling periods and the results of operation, obtained on the basis of the principle of the present invention;

FIG. 5 is a graph explaining the principle of another embodiment of the present invention, capable of reducing the phase error in sampling;

DETAILED DESCRIPTION OF THE PREFERRED EMBODIMENT

A preferred embodiment of the present invention will be described hereinafter in conjunction with the accompanying drawings.

Figure 2:
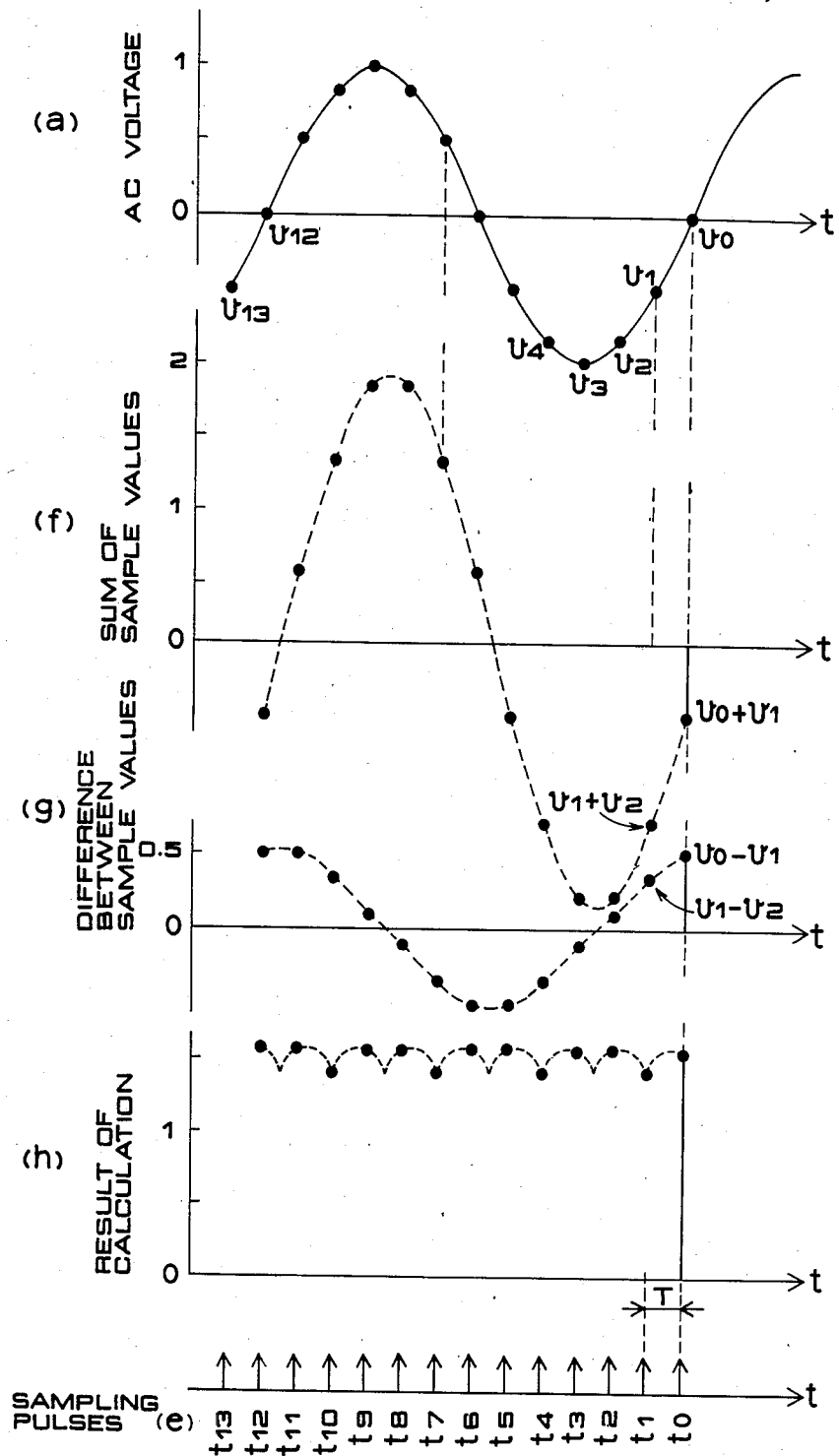
FIG. 2 is a graph showing the principle of measuring the quantity of AC analog electricity.

In FIG. 2, indicated at (a) is a quantity of AC analog electricity, which is assumed to be a voltage expressed by $v=V\sin\theta$ for the sake of explanation.

Indicated at (e) is a pulse train including sampling pulses repeated in a time sequence of $t_{13}, t_{12}, \ldots, t_4, t_3, t_2, t_1$ and $t_0$ at a pulse repetition period T. Sample values of the AC voltage (a) sampled at those times are $v_{13}, v_{12}, \ldots, v_4, v_3, v_2, v_1$ and $v_0$. Indicated at (f) and (g) are the sum of a sample value of the AC voltage at a certain time and a sample value at a time preceding the former by one sampling period, and the difference between those sample values respectively. When the AC voltage at a time $t_0$ is expressed by $v_0=V\sin\theta$, the AC voltage at a time $t_1$, a time one sampling period before the time $t_0$, is expressed by $v_1=V\sin(\theta-T)$. Accordingly, the respective values of (f) and (g) at the time $t_0$ are:

$$x_0 = v_0 + v_1 = V\{\sin\theta + \sin(\theta - T)\} \quad (2)$$

$$= 2V \cdot \cos(T/2) \sin(\theta - T/2)$$

$$y_0 = v_0 - v_1 = V\{\sin\theta - \sin(\theta - T)\} \quad (3)$$

$$= 2V \cdot \sin(T/2) \cdot \cos(\theta - T/2)$$

From Exps. (2) and (3), the following periodic function is obtained.

$$Z_0 = |V\sin(\theta - T/2)| + |V\cos(\theta - T/2)| + \quad (4)$$

$$(\sqrt{2} - 1)| |V\sin(\theta - T/2)| - |V\cos(\theta - T/2)||$$

$$= |V/2\cos(T/2)\{\sin\theta + \sin(\theta - T)\}| + |V/2\sin(T/2)$$

$$\{\sin\theta - \sin(\theta - T)\}| + |(\sqrt{2} - 1)| |V/2\cos(T/2)$$

$$\{\sin\theta + \sin(\theta - T)\}| - |V/2\sin(T/2)\{\sin\theta - \sin(\theta - T)\}||$$

$$= |k_1 V\{\sin\theta + \sin(\theta - T)\}| + |k_2 V\{\sin\theta - \sin(\theta - T)\}| + k_3||k_1 V\{\sin\theta + \sin(\theta - T)\}| - |k_2 V\{\sin\theta - \sin(\theta - T)\}||$$

$$= |k_1(v_0 + v_1)| + |k_2(v_0 - v_1)| + k_3||k_1(v_0 + v_1)| - |k_2(v_0 - v_1)||$$

where $k_1 = \frac{1}{2}\cos(T/2)$, $k_2 = \frac{1}{2}\sin(T/2)$ and $k_3 = \sqrt{2} - 1$.

If the sampling period $T = 30°$ and $\theta = nT$ ($n = 0, 1, 2, \ldots$) as shown in FIG. 2 (a), the calculated results are shown by black points shown in FIG. 2 (h). The results of calculation performed by changing $\theta$ every time are indicated by broken line in FIG. 2 (h). When $\theta = 15° + 45° \times n$ ($n = 0, 1, 2, \ldots$), the calculated value of $Z_0$ is a minimum of 1.4142 ($= \sqrt{2}$), whereas, when $\theta = 37.5° + 45° \times n$ ($n = 0, 1, 2, \ldots$), the calculated value of $Z_0$ is a maximum of 1.5307 ($= \sqrt{2}/\sin(90° - 45°/2)$).

In FIG. 3, the values of $\theta$ for providing the maximum value and the minimum value of $Z_0$ for sampling period $T = 15°, 30°, 45°, 60°$ and $120°$ are tabulated. The maximum value and the minimum value are not affected at all by the variation of $\theta$ and the period of repetition either of the maximum value and of the minimum value is a fixed value of $45°$.

Figure 4:
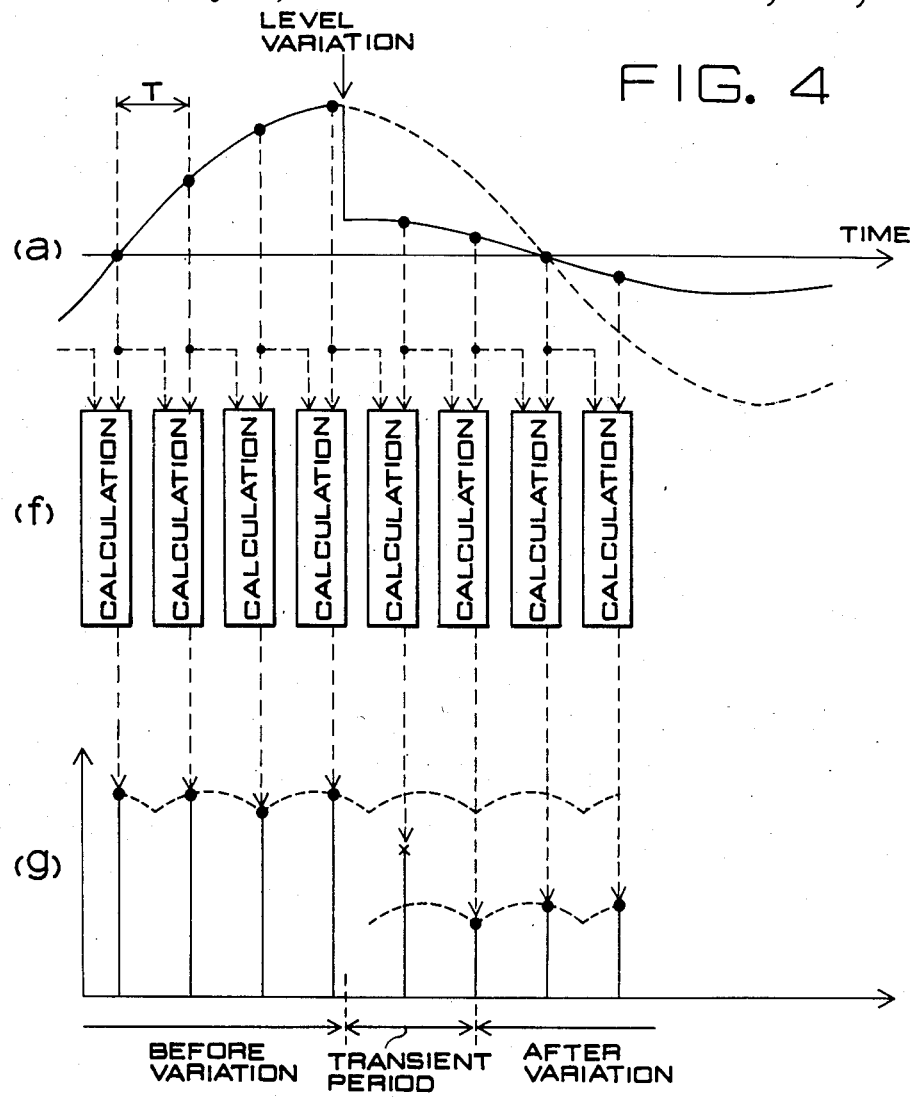
FIG. 4 is a graph explaining the principle of raising the detecting speed.

FIG. 4 shows an exemplary calculated result of the detecting speed in the case of sudden change in the AC voltage. The AC voltage (a) is sampled with a period $T = 30°$ and, as shown in (f), the Exp. (4) is operated by using each sample value and the sample value sampled one period before the former. As shown in (g), the results of calculations by using Exp. (4) are larger values before the AC voltage drops and the calculated results drop surely to smaller values in two sampling periods to the utmost, after the AC voltage has dropped to a lower level. The range between the high level and the low level is a transient period, in which the calculated results are indefinite.

Accordingly, the detecting speed is reduced to the lowest level for a period less than a time corresponding to $T + T = 2T$, namely, less than a time corresponding to a sampling period of $60°$ in the case of FIG. 4, since $T = 30°$. Thus the detection follows up the variation of the input quickly. Since the following speed increases with the decrease of the sampling period T, the sampling period T is reduced for high-speed detection without changing the accuracy, if necessary.

Examination of the calculated results in terms of sampling phase error gives a maximum sampling phase error:

$$\epsilon_0 = (1.5307 - 1.4142) \times 100/1.4142 = 8.24\% \quad (5)$$

that is, $\pm 4.12\%$.

FIG. 5 shows an exemplary manner of operation to reduce the sampling phase error, in which the mean value of three calculated results is provided. In FIG. 5, each block indicated by Calculation is an operation element which executes the operation of Exp. (4) by using sample values obtained by sampling the AC voltage (a) with a fixed sampling period, and each block indicated by "Averaging" is an operation element which executes an operation to obtain the mean value of the respective output signals of three adjacent operation elements. These operation elements execute the operation of the following Exp. (6).

$$3Z_0 = |k_1 V\{\sin(\theta - 2T) + \sin(\theta - 3T)\}| + \quad (6)$$

$$|k_2 V\{\sin(\theta - 2T) - \sin(\theta - 3T)\}| +$$

$$k_3||k_1 V\{\sin(\theta - 2T) + \sin(\theta - 3T)\}| -$$

$$|k_2 V\{\sin(\theta - 2T) - \sin(\theta - 3T)\}|| +$$

$$|k_1 V\{\sin(\theta - T) + \sin(\theta - 2T)\}| +$$

$$k_2 V\{\sin(\theta - T) - \sin(\theta - 2T)\}| +$$

$$k_3||k_1 V\{\sin(\theta - T) + \sin(\theta - 2T)\}| -$$

$$|k_2 V\{\sin(\theta - T) - \sin(\theta - 2T)\}|| +$$

$$|k_1 V\{\sin\theta + \sin(\theta - T)\}| + |k_2 V\{\sin\theta -$$

$$\sin(\theta - T)\}| + k_3||k_1 V\{\sin\theta + \sin(\theta - T)\}| -$$

$$|k_2 V\{\sin\theta + \sin(\theta - T)\}||$$

$$= |k_1(v_2 + v_3)| + |k_2(v_2 - v_3)| + k_3||k_1(v_2 + v_3)| -$$

$$|k_2(v_2 - v_3)|| + |k_1(v_1 + v_2)| + |k_2(v_1 - v_2)| +$$

$$k_3||k_1(v_1 + v_2)| - |k_2(v_1 - v_2)|| +$$

$$|k_1(v_0 + v_1)| + |k_2(v_0 - v_1)| + k_3||k_1(v_0 + v_1)| -$$

$$|k_2(v_0 - v_1)||$$

where $k_1 = \frac{1}{2}\cos(T/2)$, $k_2 = \frac{1}{2}\cos(T/2)$, and $k_3 = \sqrt{2} - 1$.

Figures 6, 8:
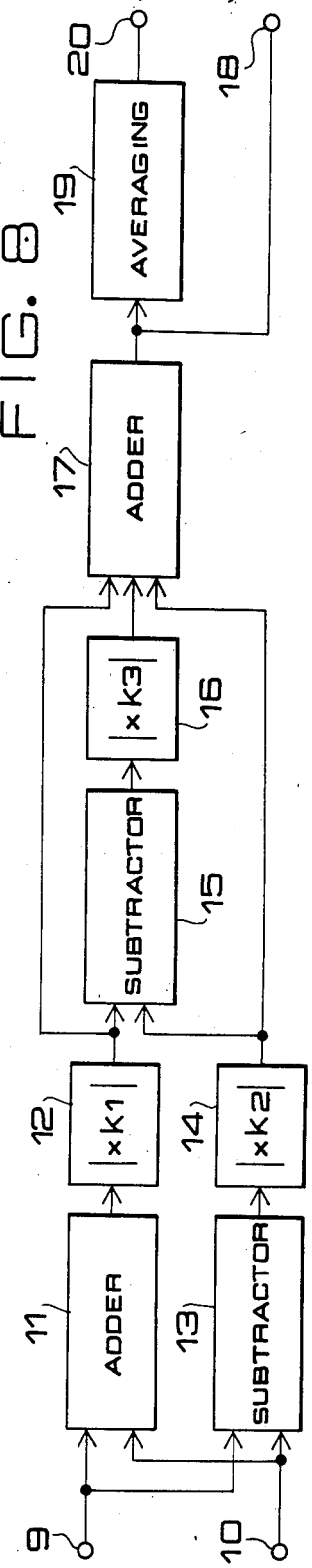
FIG. 6 is a table showing the results of operation for each sampling time.
FIG. 8 is a block diagram showing the processing procedure of the apparatus of FIG. 7.

In FIG. 5, the AC voltage is sampled at $\theta = 30° \times n$ ($n = 0, 1, 2, \ldots$), while in FIG. 6, the sampling phase is shifted to $\theta_1 = 1° + 30° \times n$ and $\theta_2 = 2° + 30° \times n$ ($n = 0, 1, 2, \ldots$). Although not shown, $(0° \sim 14°)$, $(15° \sim 29°)$, $(30° \sim 44°)$, $\ldots$ are repeatedly periodically. The results, not shown, have no relation to the sampling period T. Therefore, if three sample values are averaged, the maximum sampling phase error is reduced to:

$$\epsilon_{30} = (1.49589 - 1.48316) \times 100/1.48316 \approx 0.86\% \quad (7)$$

that is, $\pm 0.43\%$.

The calculation, similar to that of FIG. 4, of the time necessary for detection shows that the longest time is less than $T + 3T$, and hence the longest time is a time corresponding to a phase angle of $120°$ since $T = 30°$ in FIG. 5. This shows that even highly accurate detection can be achieved quickly.

Figure 7:
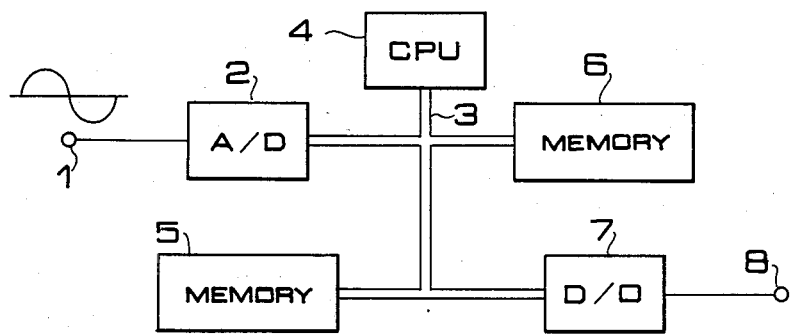
FIG. 7 is a block diagram of a component digital computer of the apparatus according to the present invention.

FIG. 7 shows a digital computer, by way of example, for carrying out the operation according to the present invention. In FIG. 7, there are shown a terminal 1 to which an AC voltage is applied, an A/D converter 2 which samples the AC voltage with a fixed sampling period T and converts the sample value into a corresponding digital value, signal passages 3, a CPU 4 for executing the operation of the Exp. (4) or (6), a RAM 5 which temporarily stores the numerical data obtained through A/D conversion, the interim values in the operation and the results of operation, a ROM stores the Exp. (4) or (6), and a D/0 which provides the digital results of operation through an external terminal 8.

FIG. 8 is a block diagram showing the processing program of the CPU 4. A terminal 9 receives current data, while a terminal 10 receives data sampled one sampling period before the former. An adder 11 carries out the operation of $V\{\sin\theta + \sin(\theta - T)\}$. The output signal of adder 11 is multiplied by the first constant $k_1$ and the absolute value of the product is produced by an absolute value circuit with a multiplier 12. A subtractor 13 carries out the operation of $V\{\sin(\theta - \sin(\theta - T)\}$ and an absolute value circuit with a multiplier 14 multiplies the output signal of the subtractor 13 by the second constant $k_2$ and produces the absolute value of the product. A subtractor 15 carries out the operation of $|k_1 V\{\sin\theta + \sin(\theta - T)\}| - |k_2 V\{\sin\theta - \sin(\theta - T)\}|$ and an absolute value circuit with a multiplier 14 multiplies result of operation of the subtractor into a corresponding absolute value and multiplies the absolute value by a third constant $k_3$. An adder 17 produces the total sum of the outputs of the devices (12), (14) and (16). The output signal 18 of the adder 17 is expressed by the Exp. (4). A device 19 averages three adjacent values. The output signal 20 is expressed by the Exp. (6).

The embodiment shown in FIG. 8 need not necessarily be a computer, but may consist of hardware such as adding circuits and subtracting circuits.

Although the present invention has been described with reference to a preferred embodiment thereof as applied to digitally processing an AC analog voltage by converting the AC analog voltage into digital values, the present invention is not limited to an apparatus for digital processing, but may be embodied in an apparatus for processing analog voltages in analog values, which gives the similar effects.

Furthermore, the present invention is applicable also to an apparatus to which a quantity of AC electricity is given in a digital value.

Although the present invention has been described as applied to measuring AC voltage, the present invention is applicable to measuring any value as far as the value varies periodically in the form of a sine wave.

The embodiment has been described as employing $\frac{1}{2}\cos(T/2)$, $\frac{1}{2}\sin(T/2)$ and $\sqrt{2}-1$ as the first, the second and the third constant respectively, however, the constants may be the approximate values of those values employed in the embodiment respectively (for example, for $T=30°$, if $\frac{1}{2}\cos(T/2) \approx \frac{1}{2}\sin(T/2) \approx 2$, and $\sqrt{2}-1 \approx \frac{1}{2}$, "$\frac{1}{2}$" and "2" can be processed by a right shift command and a left shift command respectively), for higher operation speed. The use of such approximate values as the constants reduces the operation time with slight deterioration of the accuracy.

As described hereinbefore, according to the present invention, the quantity of AC electricity is measured by using a presently sampled value and the value sampled one sampling period before, therefore, the sampling period can optionally be decided, and at least either measuring speed can be increased or measuring accuracy can be improved.

What is claimed is:

1. An apparatus for measuring the magnitude of an AC voltage, comprising:

means for sampling the AC voltage at a predetermined rate to obtain two successive sample values $v_0$ and $v_1$ of the AC voltage;

means connected to the sampling means for calculating the magnitude $Z_0$ of the AC voltage from the two successive sample values in accordance with the equation $$Z_0 = |k_1(v_0+v_1)| + |k_2(v_0-v_1)| + k_3||k_1(v_0+v_1)| - |k_2(v_0-v_1)||$$

wherein $k_1$, $k_2$ and $k_3$ are respective first, second and third predetermined constants; and means connected to the calculating means for outputting an indication of said calculated magnitude of the AC voltage.

2. An apparatus for measuring the quantity of an AC voltage according to claim 1, wherein, when the sampling period of the predetermined sampling rate is expressed by T degrees of a period of the AC voltage, the first constant $k_1$ is $\frac{1}{2}\cos(T/2)$, the second constant $k_2$ is $\frac{1}{2}\sin(T/2)$ and the third constant $k_3$ is $\sqrt{2}-1$.

3. An apparatus for measuring the quantity of an AC voltage according to claim 1 wherein the sampling period of the predetermined sampling rate is 30 degrees of a cycle of the AC voltage, the first constant $k_1$ is $\frac{1}{2}$, the second constant $k_2$ is 2 and the third constant $k_3$ is $\frac{1}{2}$.

4. An apparatus for measuring the quantity of an AC voltage according to claim 1 wherein said sampling means includes means for sampling at least three successive sample values; and said calculating means includes means for calculating a plurality of values of the magnitude of the AC voltage for the successive sample values, and means for averaging the calculated plurality of values to obtain the calculated magnitude of the AC voltage.

5. An apparatus for measuring the quantity of an AC voltage according to claim 1 wherein the calculating means includes a computer and a program for operating the computer.

* * * * *

UNITED STATES PATENT AND TRADEMARK OFFICE
CERTIFICATE OF CORRECTION

PATENT NO. : 4,667,198
DATED : May 19, 1987
INVENTOR(S) : Sunao Suzuki

It is certified that error appears in the above-identified patent and that said Letters Patent is hereby corrected as shown below:

Column 1, line 49, after "90°" insert --of--;

line 50, the word "sam" should be --sampling--.

Column 5, line 5, after "ROM" insert --6 which--;

line 21, delete " ' " and substitute -- |--;

line 22, "14 multiplies" should be --16 changes the--.

Signed and Sealed this

Third Day of November, 1987

*Attest:*

DONALD J. QUIGG

*Attesting Officer*  *Commissioner of Patents and Trademarks*